United States Patent
Lille

(10) Patent No.: US 6,579,612 B1
(45) Date of Patent: Jun. 17, 2003

(54) MAGNETOSTRICTIVE SENSOR STRUCTURE

(75) Inventor: Jeffrey S. Lille, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/344,004

(22) Filed: Jun. 24, 1999

(51) Int. Cl.⁷ .................................................. G11B 5/66
(52) U.S. Cl. ...................... 428/332; 428/336; 428/692; 428/694 R; 428/694 T; 428/694 TS; 428/694 TM; 428/900; 338/32 R; 324/209; 324/235; 324/262; 73/776; 73/779
(58) Field of Search ............................ 428/692, 694 R, 428/694 T, 694 TS, 694 TM, 900, 336, 332; 324/209, 235, 262; 73/776, 779; 338/32 R

(56) References Cited

U.S. PATENT DOCUMENTS

| | | | |
|---|---|---|---|
| 4,310,798 A | 1/1982 | Brunsch et al. | 324/209 |
| 4,393,095 A | 7/1983 | Greenberg | 65/60.52 |
| 4,884,453 A | 12/1989 | Hoffmann et al. | 73/776 |
| 5,506,672 A | 4/1996 | Moslehi | 356/514 |
| 5,589,770 A * | 12/1996 | Saitou | 324/209 |
| 5,736,457 A | 4/1998 | Zhao | 438/624 |
| 5,872,372 A * | 2/1999 | Lee | 257/254 |
| 5,889,211 A | 3/1999 | Maudie et al. | 73/720 |

OTHER PUBLICATIONS

R. M. Bowman et al., "VO₂ thin films: growth and the effect of applied strain on their resistance", Journal of Materials Science: Materials in Electronics 9 (1998), pp. 187–191.
X. Zhu et al., Jpn. J. Appl. Phys., 33, 6623 (1994).
Zhu et al., Jpn. J. Appl. Phys., 33, 6622 (1994).*

* cited by examiner

Primary Examiner—Leszek Kiliman
(74) Attorney, Agent, or Firm—G Marlin Knight; Ron Feece

(57) ABSTRACT

A sensor for measuring magnetostriction of and/or magnetic thin film is constructed by depositing a thin film nonferromagnetic electrically insulating layer followed by a thin film layer of a sensor material which is piezoresistive and nonferromagnetic. The insulating and the piezoresistive film can be etched into an appropriate pattern and orientation to provide sensitivity to strain in the magnetic film. The magnetostrictive strain in the magnetic film is induced by a known magnetic field which produces a corresponding strain in the piezoresistive film which can be measured as a change in the electrical resistance which can be detected by external probes or other measuring means. The measurement of the magnetostriction can be performed as a part of the manufacturing process for wafers with a plurality of thin film magnetic heads thereon and does not require that the wafers be removed to a laboratory.

33 Claims, 6 Drawing Sheets

MAGNETOSTRICTIVE SENSOR STRUCTURE

FIELD OF THE INVENTION

This invention relates to the field of thin film materials and more particularly the invention relates to methods and apparatus for measuring or sensing magnetostriction of thin film materials.

BACKGROUND OF THE INVENTION

Ferromagnetic and nonferromagnetic thin film materials are widely used in transducers and disks in magnetic disk drives, as well as, the semiconductor industry. The films are deposited by various processes including CVD, electroplating and sputtering.

The magnetostriction of magnetic materials such as NiFe can be correlated with the composition of the materials. Thus, it known to be useful to measure the magnetostriction of the thin films deposited in the process of making magnetic heads as a way of monitoring the quality of the process. The current way that this is done, is to remove the wafers on which the films have been deposited from the process and perform the measurements in a laboratory. This obviously involves delay and considerable expense. Thus, there is a need for a way to conveniently test the magnetostriction of materials on a wafer.

Shinji Saitou (U.S. Pat. No. 5,589,770) describes a mechanical sensor for the measurement of stress or distortion using magnetostrictive distortion in a film by layering a magneto-resistive film on top of the magnetostrictive film with an intervening thin electrically insulating film. Saitou's mechanical sensor comprises an initial layer of an amorphous ferromagnetic material having magnetostrictive properties preferably comprising at least one alloy selected from the group comprising Fe—Cr—Si—B-based, Fe—Nb—Si—B-based, Fe—V—Si—B-based, Fe—Co—Si—B-based, Fe—W—Si—B-based, Fe—Ni—Cr—Si—B-based, Fe—Ni—Nb—B-based, and Fe—Ni—Mo—B-based alloy. Saitou stated that it is preferable in the above-mentioned configuration that the amorphous magnetostrictive alloy comprise $Fe_{75}Cr4Si_{12.5}B_{8.5}$ and that the electrically insulating layer is preferably $SiO_2$. The second ferromagnetic layer must have a significant magneto-resistance effect and is preferably a NiFe alloy. A magnetic field generating means excites both of the ferromagnetic layers, and a change of magnetic flux density passing through the ferromagnetic layers resulting from a change of magnetic properties due to stress is detected as a change of resistance value arising from the magneto-resistance effect. Thus, Saitou's mechanical sensor uses magnetoresistance and magnetostriction to measure strain.

SUMMARY OF THE INVENTION

Given a thin film magnetic material deposited on a substrate such as a silicon wafer, a sensor for the magnetostriction of the magnetic film can be constructed by depositing a thin film nonferromagnetic electrically insulating layer followed by a thin film layer of a sensor material which is piezoresistive and nonferromagnetic. The insulating and the piezoresistive film can be etched into an appropriate pattern and orientation to provide sensitivity to strain vectors in the magnetic film as desired. The magnetostrictive strain in the magnetic film induced by a known magnetic field induces a corresponding strain in the piezoresistive film which can be measured as a change in the electrical resistance which can be detected by external probes or other measuring means. The measurement of the magnetostriction can be performed as a part of the manufacturing process and does not require that the wafers be removed to a laboratory. It is preferable that the insulating and sensor layers be thinner than the magnetic layer to maximize the transmission of the strain. Duplicate piezoresistive films can be deposited over insulated areas where there is no underlying magnetostrictive film to provide a value for a differential measurement.

The preferred embodiment described below uses the sensor as a part of the process of manufacturing the wafers from which a plurality of magnetic heads will be cut for use in disk or tape drives. The sensors can be built in otherwise unused locations on the wafer, for example, in the saw kerf areas. The sensors may be built and used when the wafer is in an intermediate point in the build process and/or after the heads on the wafer are essentially complete.

DETAILED DESCRIPTION OF THE PREFERRED EMBODIMENTS

The invention can be usefully employed in a wide range of thin film processes and devices, but the embodiment of the invention to measure magnetostriction in a magnetic film suitable for use in a magnetic read/write head of a type used in disk and tape drives will be described. The particular materials and thicknesses, for example, may be somewhat unique to the particular application, but one of ordinary skill in the art will be able to adapt the teachings of the invention to other environments.

Figure 3:
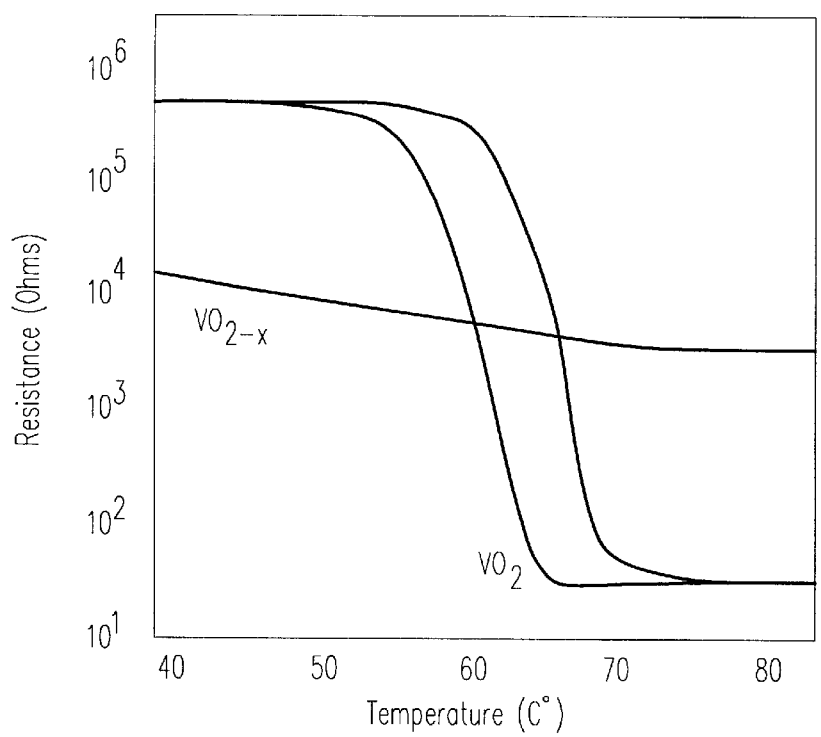
FIG. 3 is a graph of the resistance versus temperature of $VO_2$ and $VO_{2-x}$.
Figure 4:
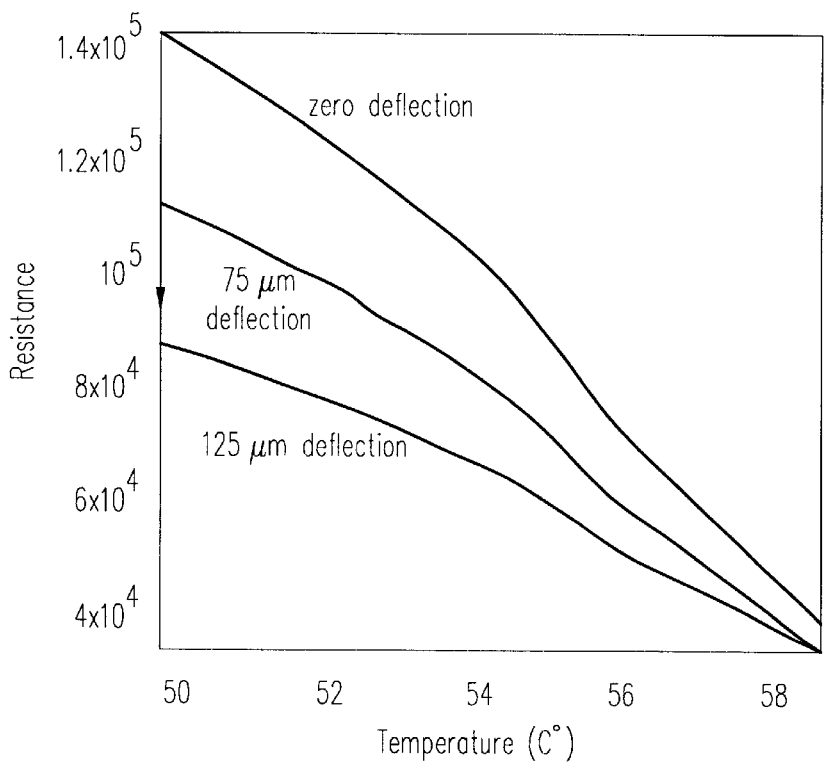
FIG. 4 is a graph of the resistance versus temperature of $VO_2$ for three values of deflection.

To insure that the effects of magnetic film and the sensor film are separated, a non-ferromagnetic alloy is used for the sensor film so that it will react only to differences in the strain of the magnetic layer induced by a magnetic field. Thus, a nonmagnetic piezoresistive material is used for the sensor layer. The preferred material for the sensor is vanadium oxide. Vanadium oxide is a low conductance oxide that is easily sputtered onto a wafer using vanadium targets and oxygen in the sputtering chamber. High uniformity is obtainable and control over the composition is achieved through varying of the partial pressure of oxygen in the sputtering chamber according to principles known in the art. This oxide has been measured to change resistance under stress between the temperatures of 52 and 62 C. and an even larger resistance change is implied at lower temperature (e.g. at room temperature). FIG. 3 is a graph of the resistance of $VO_2$ and $VO_{2-x}$ temperature. However, even at the elevated temperature, the demonstrated, unoptimized sensitivity of the $VO_2$ film was 0.13–0.16 dR/R per $10^{-6}$ dL/L induced strain. (See R. M. Bowman, J. M. Gregg, J. of Mater.Sci-.:Materl in Electronics., 9, 187 (1998)). FIG. 4 is a graph of the resistance of a $VO_2$ sample versus temperature for three different levels of deflection, i.e., 0, 75 microns and 125 microns. The graph shows that the resistance decreases from $1.4 \times 10^5$ to less than $1 \times 10^5$ with increases in deflection from zero to 125 microns at a constant 50 C. temperature for the particular sample. There is no clear lower limit to the temperature which at which the resistance should be measured, but the upper limit is bounded by the point at which destructive changes occur in the underlying structures or the sensor itself.

Since it is desirable to maximize the stress induced in the sensor film structure, the combined thickness of the insulating and sensor films should preferably be thinner than the magnetic film. Preferably the combined sensor and insulating layers should be 10% or less of the thickness of the magnetic layer which should ensure that the sensor film will be subjected to significant stress by the action of the magnetic layer. Typical magnetic film thickness are between 1 and 4 microns for current magnetic read/write heads, so the insulating film and the piezoresistive film can be as thin as 5% or less of the thickness of the magnetic layer, e.g., 50 nm or less.

Figure 1:
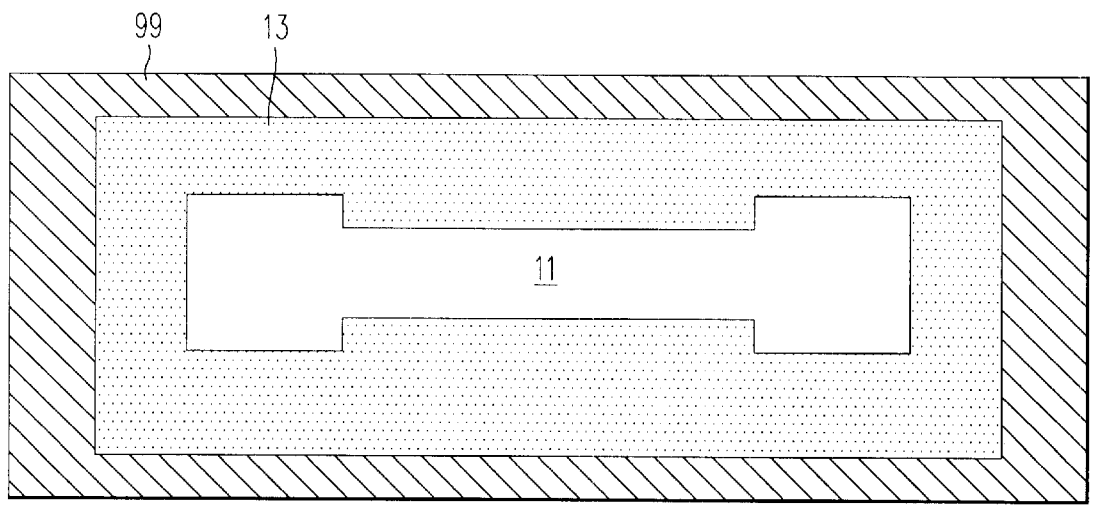
FIG. 1 illustrates a top view of a sensor according to the invention showing the piezoresistive film on top of an insulating film.
Figure 2:
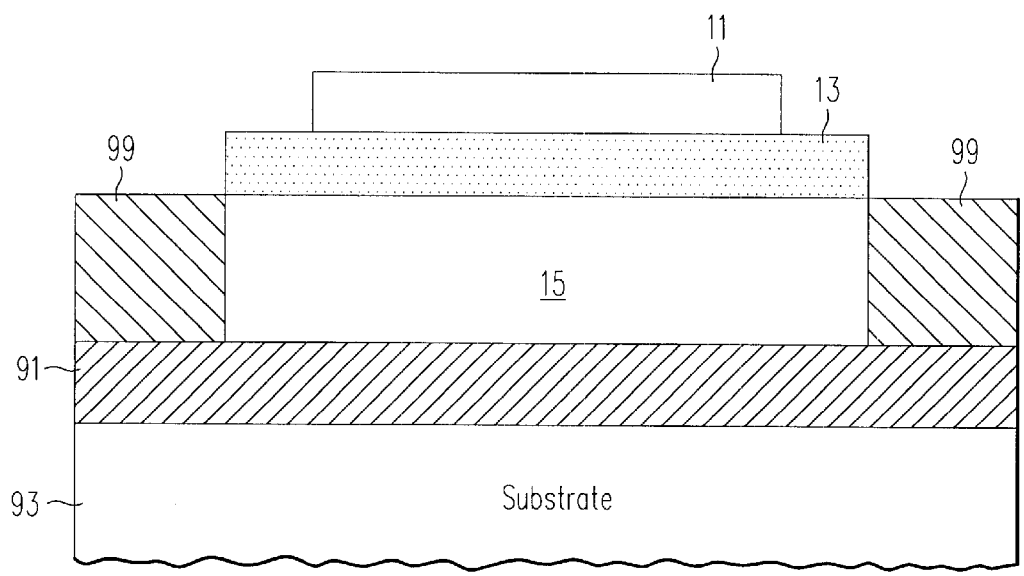
FIG. 2 illustrates a cross-section view of the sensor film layer structure according to the invention.

An illustration of a top view of a sensor structure embodying the invention is shown in FIG. 1. The piezoresistive sensor film 11 is formed into a shape which facilitates measuring the resistance, for example, a dog bone or dumbbell shape on the surface of an electrically insulating layer 13. The so-called dog bone shape has a connecting portion extending between two end pads which are used for the probe points. The magnetic layer is not shown in this view, but the ring of insulating material 99 which surrounds the magnetic layer is shown. FIG. 2 shows a cross-section of the sensor which reveals the magnetic layer 15 under the electrically insulating layer 13. The piezoresistive sensor film need not be co-extensive with the underlying magnetic film which for magnetic heads is currently approximately 0.4 square microns. To determine the measure of the magnetostriction of the magnetic film, the electrical resistance of the sensor film is measured when no magnetic field is present, preferably by contacting probes to the end pads, and then again while an induced magnetic field is applied in either a transverse, longitudinal, or perpendicular direction to the piezoresistive sensor film. Anisotropic stress and therefore anisotropic resistance are likely, so for some applications, it may be desirable to measure the changes in the resistance. Magnetic materials with higher magnetostriction will induce higher levels of strain in the sensor relative to materials with lower levels of magnetostriction. A second possible embodiment has the piezoresistive sensor formed in a relatively narrow strip over the magnetic layer which extends beyond the sides of the piezoresistive film. This alternative produces an asymmetrical, out of plane stress when the magnetic field is perpendicular to the plane of the wafer and thus induces a strain perpendicular to the plane of the film. In either of these embodiments the applied magnetic field causes the magnetic material to induce a stress, in proportion to its magnetostrictive property, in the piezoresistive sensor. The stress in the piezoresistive sensor manifests as a change in the electrical resistance of the sensor which can be measured using known techniques including the four probe technique. If the sensor of the invention were combined with semiconductor components, then a higher level of processing of the raw change in resistance could be achieved on a chip.

Figure 6:
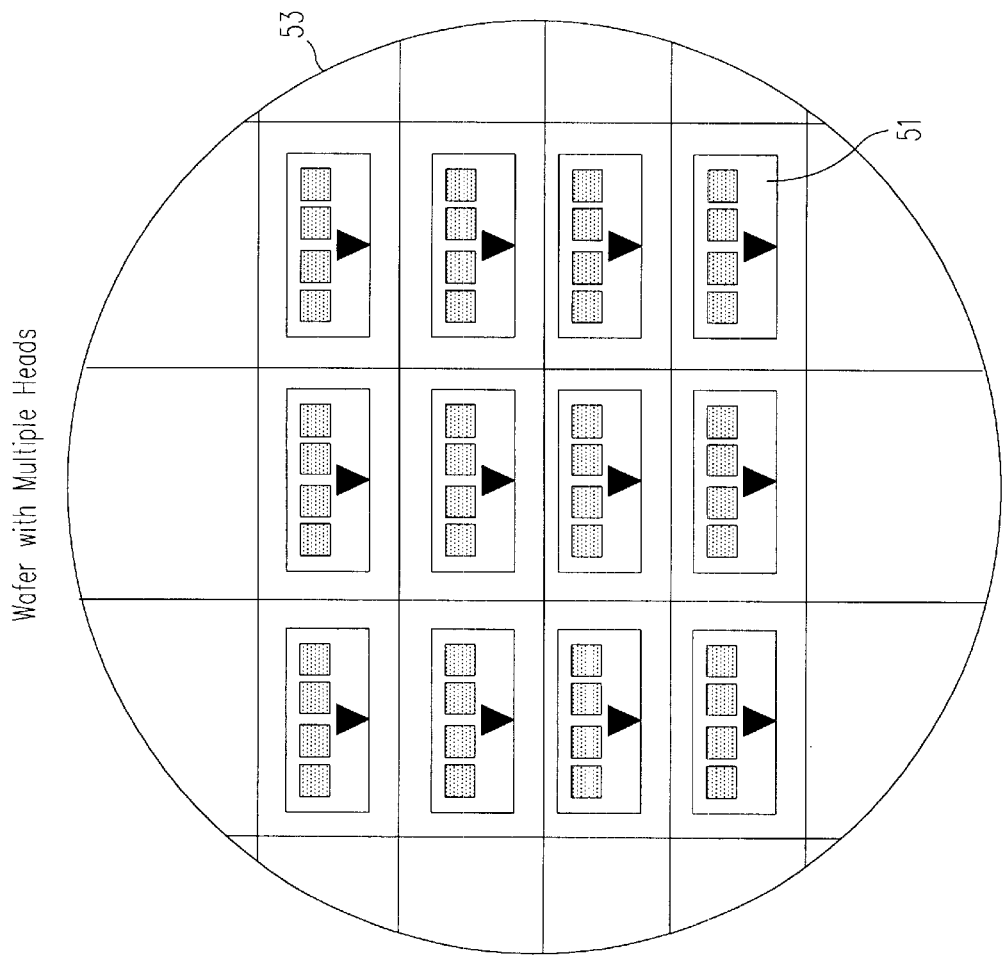
FIG. 6 illustrates a subsection of a wafer containing multiple magnetic head structures.
Figure 5:
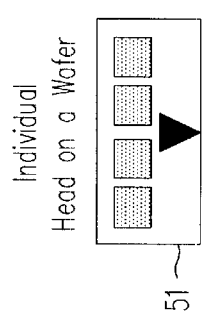
FIG. 5 shows the symbol used for a single magnetic head structure on a wafer.

FIGS. 5 and 6 illustrate in symbolic form a individual magnetic head 51 which is cut from a wafer 53 containing multiple heads. The layers for the heads are built-up on the wafer in a series of process steps in which materials are deposited, masked and etched by processes known to those in the art.

Figure 7:
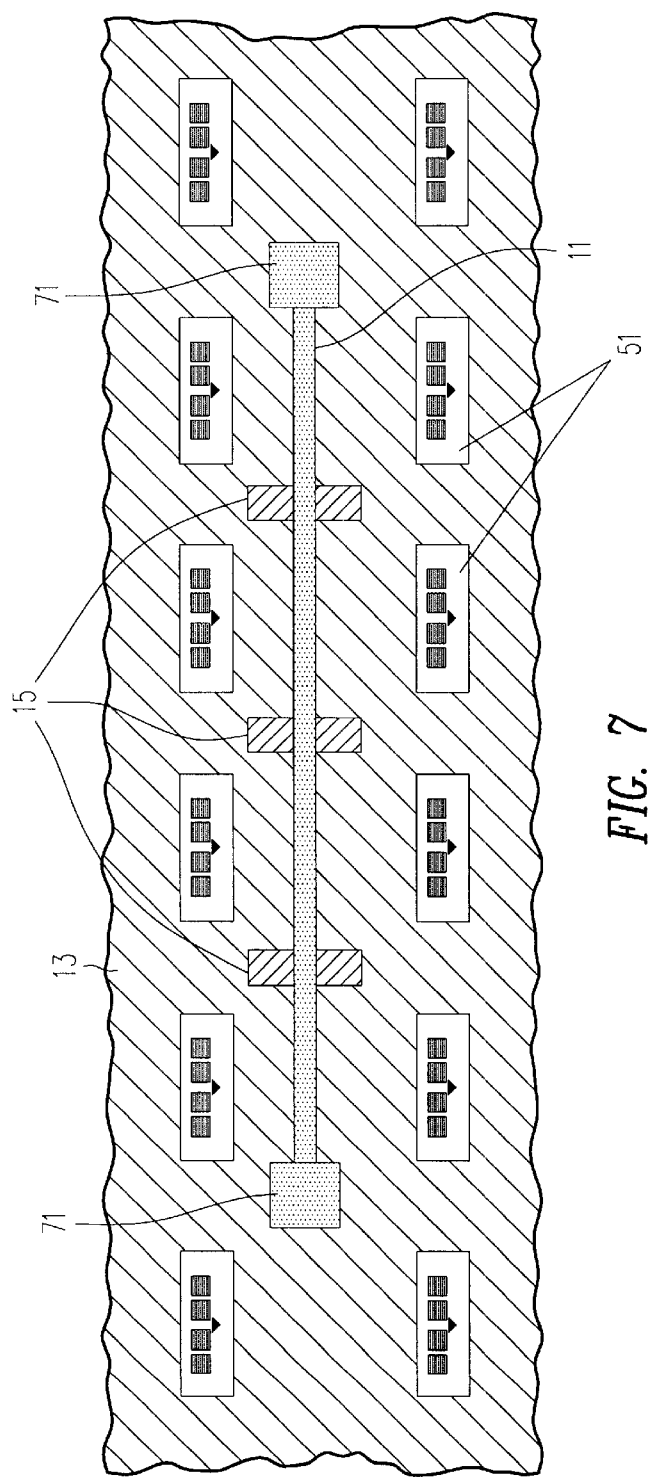
FIG. 7 illustrates a subsection of a wafer containing multiple magnetic head structures and a sensor structure according to the invention.
Figure 8:
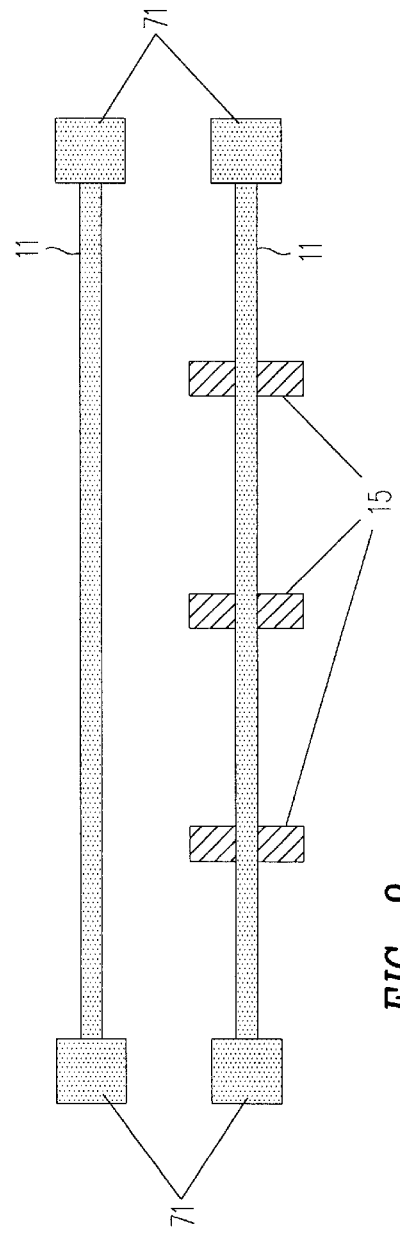
FIG. 8 illustrates an embodiment of a sensor structure according to the invention using a duplicate sensor to allow a differential measurement.

The magnetic layer is deposited on the wafer using standard techniques appropriate for the application such as for magnetic heads. In general, the magnetic layer can be deposited using any thin film deposition technique appropriate for the particular application including electroplating and sputtering. The magnetic layer is masked and etched to form an "island" of magnetic material for the sensor. Conventional deposition, masking and etching techniques are applied to the wafer to form the island and the three additional components or layers required for the sensor. The first isolation ring 99 isolates the island magnetic film from its lateral surroundings and is preferably an oxide with very low conductance and a high breakdown field, e.g., aluminium oxide. The portion of the first isolation layer which is deposited on the magnetic island is removed in a planarazation process leaving the oxide surrounding the island of magnetic material. A second isolation layer, i.e. the sensor insulating layer 13, is deposited on the magnetic material. The sensor insulating layer electrically isolates the magnetic film from the layers above it. The sensor insulating layer which is preferably $SiO_2$, but can be any material which is nonmagnetic and electrically insulating including doped $SiO_2$, $Al_2O_3$, $Y_2O_3$, $CeO_2$, $CaO_2$, $ZrO_2$, or combinations thereof. Any known method of depositing a thin film of the selected insulating material. If $SiO_2$ is used, a convenient way to deposit is chemical vapor deposition (CVD) using the reaction $SiH_4 + O_2 \rightarrow SiO_2 + H_2$. It is preferable that the first isolation layer be harder than the sensor insulating layer and this condition is satisfied by the selection of aluminum oxide for the first isolation layer and silicon dioxide as the sensor insulating layer. A sensor insulating layer material with a lower hardness may transmit a greater percentage of the magnetostrictive stress to the sensor layer while a harder surrounding isolation material to lower the amount of the stress transmitted away from the sensor. The third film to be deposited is the piezoresistive sensor film 11, which is preferably vanadium oxide ($VO_2$). The sensor film is preferably masked and etched into a form which facilitates the measurement of the resistance such as a strip or dogbone shaped structure such as is illustrated in FIGS. 7 and 8. Using the example of fabricating the sensor as a part of magnetic head fabrication process, one method is to mask then etch part of a permalloy layer, which forms the so-called "shield 1 (S1)" in a common type of MR or GMR head. The permalloy layer for the magnetic heads is deposited over the entire wafer even though only selected portions will remain in the actual heads. Any unused area of the permalloy can be masked out and etched to form an isolated island of permalloy for the sensor, e.g. element 15 in FIG. 7. A damascene process can be used to fill up the trench around the permalloy. In the damascene process material is "inlaid" in previously formed valleys and the higher portions above the valleys are removed by surface chemical mechanical polishing (CMP).

After etching out the permalloy structure, the wafer is blanket deposited with an electrically insulating layer. After this step the surface will be planarized by CMP. At this point two alternatives are available: either depositing the sensor insulating material, e.g., $SiO_2$, or depositing the MR layers along with a masked insulating layer. In other words, the piezoresistive sensor layers can be deposited over a permalloy layer by itself or over a multiple layer structure including the permalloy layer and the MR layers. In the latter case the sensor will obviously be responding to the combined magnetostriction of the aggregate structure. However, since the MR layers used in current heads are extremely thin, their effect of the measurement may be negligible.

Following the insulating layer, the piezoresistive layer would be deposited, masked and etched into a shape which can be electrically probed at the opposite ends of the piezoresistive layer. Preferably the insulating layer should be etched away around the sensor to allow the stress in the magnetic film(s) to be passed to the sensor film without being distributed across a large section of the insulating material.

One or more islands of the magnetic material may lie under a continuous strip of the sensor material; thus, FIG. 7 shows three separate strips of magnetic material 15 under a single strip of piezoresistive material 11 extending between the contact pads. It is also possible for a plurality of sensor strips to be positioned at different lateral positions over a single magnetic strip.

There are many piezoresistive films that are available that exhibit negligibly small hysteresis and no ageing effects and are useful for the sensor structure of the invention. These materials include $PbO—MgO—Nb_2O_5$, $PbTiO_3$, $Pb_3ZnNb_2O_9$, $VO_2$ and $BaTiO_3$ (See for example, Xinhua Zhu, et al., Jpn. J. Appl.Phys., 33, 6623 (1994)). Induced strain effects the electrical properties of these films and these properties are further altered by film dopants and temperature. For fixed dopant levels and testing temperatures, the measured induced strain in the sensor structure of the invention using these materials will only be from the magnetostriction of the adjacent magnetic film. Vanadium oxide, which is the preferred material, will be the only material considered hereinafter.

The ends or contact pads 71 of the $VO_2$ sensor strip preferably provide space for a standard four point probe to measure the resistance of the $VO_2$. Once the sensor film is in electrical contact with the probe, the test structure will be exposed to a transverse, longitudinal, and/or perpendicular magnetic fields. If the magnetic film is magnetostrictive, the film will expand or contract transferring a stress to the sensor film. This stress will be translated into a near linear change in the resistance if the sensor is in the appropriate temperature range. As illustrated in FIG. 8, another possible option is the formation of a second identical sensor/insulator structure which is not over a magnetic film, and thereby, provides a baseline resistance of a similar strip of the sensor material in the operating environment. By probing both sensor structures, a differential measurement, with the known advantages associated therewith, can be made to help discern the true stress induced change in resistance from electrical and thermal noise, etc.

Since the size of the wafer allows for it, it is preferable to include multiple sensors in one or more of the configurations described herein on each wafer. This will provide redundancy in the case of failures and multiple test points so that local effects can be averaged out.

Figure 9:
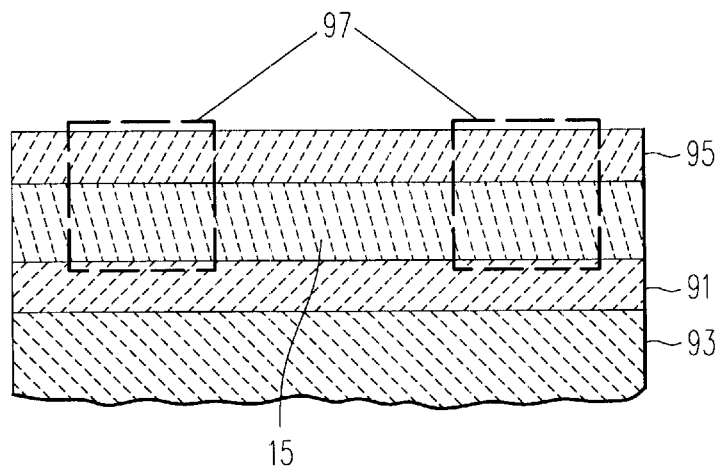
FIG. 9 illustrates the cross-section of the layer structure at one point during a process for making a sensor according to the invention after the magnetic layer has been deposited and masked.
Figure 10:
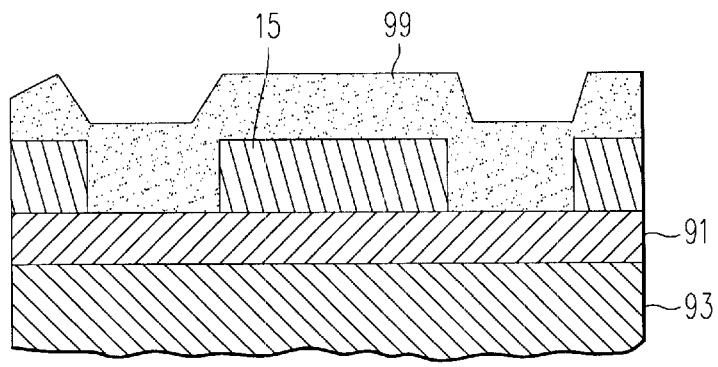
FIG. 10 illustrates the cross-section of the layer structure at a point during a process for making a sensor according to the invention after a first etching process, removal of the remaining mask and a layer of nonmagnetic filler material has been deposited.
Figure 11:
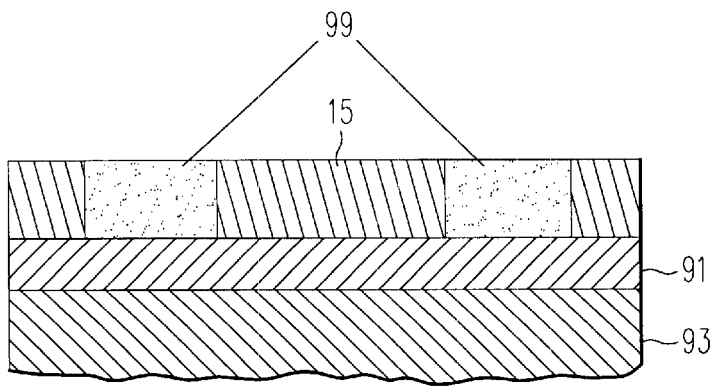
FIG. 11 illustrates the cross-section of the layer structure at a point during a process for making a sensor according to the invention after planarizing the structure which removes the alumina above the magnetic material while leaving the alumina in the etched trench surrounding the magnetic material.
Figure 12:
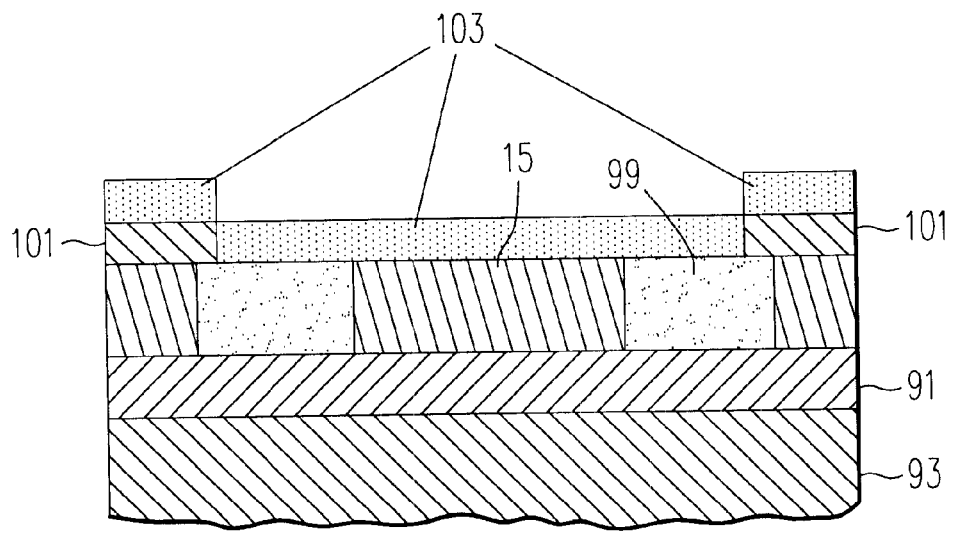
FIG. 12 illustrates the cross-section of the layer structure at a point during a process for making a sensor according to the invention after a photo resist 101 has been deposited and etched and a layer of electrically insulating material such as silicon dioxide ($SiO_2$) 103 has been deposited.
Figure 13:
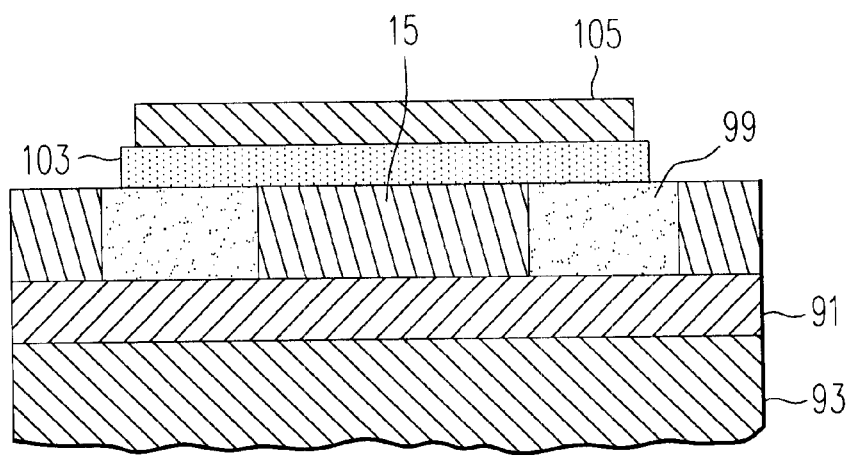
FIG. 13 illustrates the cross-section of the layer structure at a point during a process for making a sensor according to the invention after the insulating layer 103 has been etched to form the island of material for the sensor, the piezoresistive layer has been deposited and etched into the island for the sensor, thus completing the sensor.

FIGS. 9–13 illustrate selected points in a process for making the sensors of the invention. FIG. 9 shows the layer structure before any etching has been performed. The substrate 93, for example, N58 silicon, has an initial layer of alumina 91 which isolates the subsequent layers from the substrate 93 and then the magnetic layer 15. As indicated above, the magnetic layer should be much thicker than the insulating and piezoresistive layers, so the thickness of the layers have been made comparable only for the purpose of illustration. A mask 95 has been deposited on the magnetic layer in preparation for etching. The two dashed line boxes indicated the areas of the magnetic layer and the mask which will be etched away. FIG. 10 shows the layer structure after first etch, removal of the remaining mask and after a layer of nonmagnetic filler material 99 such as alumina has been deposited. FIG. 11 shows the result of planarizing the structure which removes the alumina above the magnetic material 15 while leaving the alumina in the etched trench surrounding the magnetic material. FIG. 12 illustrates the stage in the process after photoresist 101 has been deposited and etched and a layer of electrically insulating material such as silicon dioxide ($SiO_2$) 103 has been deposited. FIG. 13 shows that the insulating layer 103 has been etched to form the island of material for the sensor, the piezoresistive layer has been deposited and etched into the island for the sensor, thus completing the sensor.

In a process for manufacturing magnetic heads, the sensor of the invention can be used to perform tests at intermediate stages and/or after the heads have been completed. By allowing the measurement of the magnetostriction of a selected portion of the magnetic material used at any point in the head structure, the sensor provides a way to monitor the quality of the process. If the magnetostriction is outside of the allowable range, then the process engineer knows that the particular wafer is probably defective and may be alerted to process problems that would otherwise not be discovered until later after more production was lost. If wafers are determined to fail the test in mid-process, then the time and cost of further processing is avoided by aborting the manufacturing process. After the layers of the sensor have been deposited, the resistance of the piezoresistive element can preferably be measured before and/or after the stress is applied for a baseline value. The resistance of the piezoresistive element is then measured while generating a magnetic field of known strength in the magnetic material. The magnetostriction is inferred, calculated or derived from the resistance measurements and may include use of a duplicate sensor which has no magnetic material under it for a differential measurement. Larger changes in the resistance of the piezoresistive element will result from larger stresses which in turn result from the magnetostriction properties of the magnetic magnetic element responding to the magnetic field. As with any manufacturing parameter a range of acceptable values must be determined by calculation and/or experiments for the value of the resistance or difference in resistance. This range will vary with many factors including the particular materials, the size and shape of the sensor layers, the relative thickness of the magnetic and the sensor layers, the strength of the magnetic field, etc.

An alternative use of the sensor of the invention is to use it to sense or measure the strength of the magnetic field acting on the magnetic material in the sensor. In the application described above the strength of the magnetic field was known and the magnetostriction of the material was being measured. It follows that if the magnetostriction of the magnetic material is known, then information about the strength of the magnetic field acting on the sensor structure can be derived.

As with any sensor calibration is required to allow the change in resistance of the piezoresistive element to be mapped to a value of magnetostriction or the strength of the magnetic field.

While the compositions listed above have been given without regard to contamination percentages, it is known to those skilled in the art that some contamination is normally if not always present in thin films. Sputtering targets are typically specified as 99.9% or greater purity when used for magnetic head production, but the resulting films may have lower purity due to contamination in the sputtering chamber or other factors. For example, contamination by air in the chambers might result in measurable amounts of oxygen and/or hydrogen being incorporated into the film. It is also possible for small amounts of the working gas in the sputtering system, e.g. argon, to be incorporated into a sputtered film. Contamination levels were not specifically measured in the material samples described and, therefore, were assumed to be within normal ranges for thin film disks expected by those skilled in the art.

While the preferred embodiments of the present invention have been illustrated in detail, it will be apparent to the one skilled in the art that alternative embodiments of the invention are realizable without deviating from the scope and spirit of the invention.

What is claimed is:

1. A thin film structure for measuring magnetostriction in a magnetic material comprising:
    a thin film layer of a magnetic material;
    a nonmagnetic electrically insulating thin film layer in physical contact with the thin film layer of a magnetic material; and
    a piezoresistive film in physical contact with the electrically insulating thin film layer.

2. The thin film structure of claim 1 wherein the nonmagnetic electrically insulating thin film layer and the piezoresistive film have a combined thickness which is less than a thickness of the thin film layer of magnetic material.

3. The thin film structure of claim 2 wherein the electrically insulating thin film layer and the piezoresistive film have a combined thickness which is less than 10% of a thickness of the thin film layer of magnetic material.

4. The thin film structure of claim 1 wherein the piezoresisitve film comprises vanadium oxide.

5. The thin film structure of claim 1 wherein the piezoresistive film comprises $BaTiO_3$.

6. The thin film structure of claim 1 wherein the piezoresistive film comprises $PbO—MgO—Nb_2O_5$ or $Pb_3ZnNb_2O_9$.

7. The thin film structure of claim 1 wherein the piezoresistive film comprises $PbTiO_3$.

8. The thin film structure of claim 1 wherein the piezoresistive film is vanadium oxide and the electrically insulating thin film layer is silicon dioxide.

9. The thin film structure of claim 1 wherein the piezoresistive film is formed in a dog bone shape having a connecting portion extending between two end pads and the connecting portion lies over the magnetic film.

10. The thin film structure of claim 9 wherein the magnetic film is divided into two or more portions which lie under the connecting portion of the piezoresistive film.

11. The thin film structure of claim 1 further comprising a ring of isolation material surrounding the magnetic material in a lateral plane, the isolation material having a hardness greater than a hardness of the electrically insulating layer.

12. A wafer used for manufacturing a plurality of thin film heads comprising:
    one or more thin films of magnetic material; and
    at least one magnetostriction sensor comprising:
        a thin film structure of the magnetic material;
        an first electrically insulating thin film structure in physical contact with the thin film structure of the magnetic material; and
        a first piezoresistive film in physical contact with the electrically insulating thin film structure.

13. The wafer of claim 12 wherein the first electrically insulating thin film structure and the first sensor film have a combined thickness which is less than a thickness of the thin film structure of the magnetic material.

14. The wafer of claim 13 wherein the first electrically insulating thin film structure and the first sensor film have a combined thickness which is less than 10% of the thickness of the thin film structure of the magnetic material.

15. The wafer of claim 12 wherein the piezoresistive film is vanadium oxide.

16. The wafer of claim 12 wherein the piezoresistive film is $BaTiO_3$.

17. The wafer of claim 12 wherein the piezoresistive film is $PbO—MgO—Nb_2O_5$.

18. The wafer of claim 12 wherein the piezoresistive film is $PbTiO_3$.

19. The wafer of claim 12 wherein the piezoresistive film is $Pb_3ZnNb_2O_9$.

20. The wafer of claim 12 wherein the piezoresistive film is vanadium oxide and the electrically insulating thin film layer is silicon dioxide.

21. The wafer of claim 12 wherein the piezoresistive film is formed in a shape having a connecting portion extending between two end pads and the connecting portion lies over thin film structure of the magnetic material.

22. The wafer of claim 21 wherein the thin film structure of magnetic material comprises two or more islands which lie under the connecting portion of the piezoresistive film.

23. The wafer of claim 12 further comprising isolation material surrounding the thin film structure of the magnetic material in a lateral plane, the isolation material having a hardness greater than a hardness of the first electrically insulating structure.

24. The wafer of claim 1 further comprising a second electrically insulating structure deposited over a nonmagnetic material; and a second piezoresistive film deposited on the second electrically insulating structure.

25. A method of manufacturing thin film magnetic heads on a wafer comprising the steps of:
    forming a first sensor by:
        forming a magnetic element comprising a thin film of magnetic material,
        forming a first electrically insulating element comprising a thin film of nonmagnetic electrically insulating material above the magnetic element, and
        forming a first piezoresistive element comprising a thin film of nonmagnetic piezoresistive material above the electrically insulating material;
    generating a magnetic field in the magnetic element; and
    measuring an electrical resistance of the first piezoresistive element while the magnetic field is being generated in the magnetic element.

26. The method of claim 25 further comprising the step of aborting or continuing the manufacturing of the thin film magnetic heads on the wafer based on the electrical resistance of the first piezoresistive element while the magnetic field is being generated in the magnetic element.

27. The method of claim 25 further comprising the step of finding a baseline electrical resistance by measuring an electrical resistance of the first piezoresistive element when no magnetic field is being generated in the magnetic element.

28. The method of claim 25 further comprising the steps of:
    forming a duplicate sensor by forming a second electrically insulating element of a thin film of electrically insulating material above a selected portion of the wafer where there is no magnetic material and forming a second piezoresistive element comprising a thin film of nonmagnetic piezoresistive material above the electrically insulating material;
    measuring the resistance of the second piezoresistive element of the duplicate sensor; and
    determining a difference between the electrical resistance of the first piezoresistive element and of the second piezoresistive element.

29. The method of claim 25 wherein the nonmagnetic piezoresistive material comprises vanadium oxide.

30. The method of claim 28 further comprising the step of heating or cooling the first piezoresistive element before the measuring step to establish a temperature in a predetermined range.

31. The method of claim 25 wherein the nonmagnetic piezoresistive material comprises $BaTiO_3$.

32. The method of claim 25 wherein the nonmagnetic piezoresistive material comprises $PbO-MgO-Nb_2O_5$ or $Pb_3ZnNb_2O_9$.

33. The method of claim 25 further comprising the steps, executed after the step forming a magnetic element, of:
    etching away a selected area surrounding a selected area of magnetic material to form an island of magnetic material;
    depositing isolation material around and on the island, the isolation material comprising a nonmagnetic electrically insulating material; and
    planarizing to remove the isolation material on the island while leaving the isolation material around the island.

* * * * *